US006251759B1

(12) United States Patent
Guo et al.

(10) Patent No.: US 6,251,759 B1
(45) Date of Patent: Jun. 26, 2001

(54) METHOD AND APPARATUS FOR DEPOSITING MATERIAL UPON A SEMICONDUCTOR WAFER USING A TRANSITION CHAMBER OF A MULTIPLE CHAMBER SEMICONDUCTOR WAFER PROCESSING SYSTEM

(75) Inventors: Xin Sheng Guo, Los Altos Hills; John V. Schmitt; Shih-Hung Li, both of Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/165,661

(22) Filed: Oct. 3, 1998

(51) Int. Cl.$^7$ ............................. H01L 21/20; H01L 21/44
(52) U.S. Cl. ........................ 438/584; 438/682; 438/687
(58) Field of Search ................... 438/584, 687, 438/682, 761

(56) References Cited

U.S. PATENT DOCUMENTS

| 5,310,410 | 5/1994 | Begin et al. | .................. 29/25.01 |
|---|---|---|---|
| 5,695,564 | * 12/1997 | Imahashi | .............................. 118/719 |
| 5,821,168 | * 10/1998 | Jain | ...................................... 438/692 |
| 6,037,258 | * 3/2000 | Liu et al. | .............................. 438/687 |
| 6,046,097 | * 4/2000 | Hsieh et al. | ........................ 438/584 |

FOREIGN PATENT DOCUMENTS 0 881 673 A2   12/1998   (EP) ........................... H01L/21/768

\* cited by examiner

*Primary Examiner*—John F. Niebling
*Assistant Examiner*—Walter L. Lindsay, Jr.
(74) *Attorney, Agent, or Firm*—Thomason, Moser & Patterson LLP

(57) ABSTRACT

An improvement in the deposition of materials in a multiple chamber semiconductor processing cluster tool comprising a first cluster of first chambers, a second cluster of second chambers and a transition chamber located between the first cluster and the second cluster, where the transition chamber is adapted to deposit a material upon a wafer. Specifically, the transition chamber provides a flash coating of PVD copper on the wafer which significantly improves the adhesion of subsequently CVD deposited bulk copper without sacrifice in the throughput of the cluster tool.

9 Claims, 3 Drawing Sheets

METHOD AND APPARATUS FOR DEPOSITING MATERIAL UPON A SEMICONDUCTOR WAFER USING A TRANSITION CHAMBER OF A MULTIPLE CHAMBER SEMICONDUCTOR WAFER PROCESSING SYSTEM

BACKGROUND OF THE DISCLOSURE

1. Field of the Invention

This invention relates to semiconductor wafer processing systems and, more particularly, to a method and apparatus for depositing a material upon a semiconductor wafer using a transition chamber of a multiple chamber semiconductor wafer processing system.

2. Description of the Background Art

Semiconductor wafer processing systems comprised of multiple process chambers are well known in the art. Within these systems, wafers are prepared and processed through the deposition and treatment of multiple layers of conductive and semiconductive materials. Such tools process semiconductor wafers through a plurality of sequential steps to produce integrated circuits. In such tools, a plurality of process chambers and preparatory chambers are arranged in one or more clusters, each served by robotic transfer mechanism. Hence, such tools are commonly referred to as cluster tools. Such cluster tools include the Endura and Centura systems manufactured by Applied Materials, Inc. of Santa Clara, Calif.

The chamber clusters in a cluster tool are typically arranged by function with related functions being in separate clusters. For example, in the Endura cluster tool used for metal deposition, there is a pre-metallization cluster where the wafers are admitted, oriented, degassed, sputter cleaned, subsequently cooled down and removed from the apparatus and at least one metallization cluster of process chambers wherein metal deposition, e.g., copper deposition, is performed. The various chambers of the pre-metallization cluster are serviced by a centrally located robotic transfer mechanism that is enclosed in a buffer chamber. Similarly, the process chambers of the process cluster are serviced by a centrally located robotic mechanism that is enclosed in a transfer chamber. Connecting these two clusters are transition chambers for moving the wafers between the metallization and pre-metallization clusters. These transition chambers are typically utilized for comparatively uncomplicated operations such as precleaning of the wafers prior to processing and cool down of the wafers after processing.

Copper is typically deposited onto wafers in such cluster tools by chemical vapor deposition ("CVD") in a sequence of process chambers to build up a plurality of layers. A layer of CVD copper may also be used as a seed layer for electroplating or as a seed layer for copper deposited by physical vapor deposition ("PVD"). Generally, copper is deposited using a PVD process when it is desired to deposit copper at low temperatures. All of these copper deposition processes have experienced problems with adhesion of the copper to the substrate.

Several possible solutions to the problem of poor adhesion have been proposed. One of these proposed solutions is to initially deposit a copper layer by physical vapor deposition ("PVD") (i.e., PVD copper) as a seed layer. PVD deposition is performed using a magnetron sputtering process by placing a copper target above the wafer substrate, providing a gas, such as argon, between the target and the substrate and exciting the gas with a high-voltage DC signal to create ions that strike the target. As the target is bombarded by ions, copper atoms are dislodged and become deposited onto the substrate. The dislodged copper atoms generally have substantial kinetic energy and when they impact the substrate the atoms tend to strongly adhere to the substrate.

While the thin layer of PVD copper provides the necessary adhesion, the PVD process does not provide sufficient step coverage to permit the PVD process to be used for bulk copper deposition. As such, the bulk copper deposition is accomplished by an electroplating or a CVD process. Because PVD deposition and either electroplating or CVD deposition cannot be accomplished in the same chamber, an additional chamber must be added to the cluster tool's metallization cluster. As such, deposition of such a PVD seed layer would require the sacrifice of one of the processing chambers in the process cluster of a cluster tool to make room for the additional PVD chamber. This would adversely affect the throughput of the cluster tool since such a chamber would ordinarily be utilized for a more demanding and/or time-consuming CVD process step.

Furthermore, an additional chamber would require approximately 10 seconds to position a wafer in the chamber and ready the chamber for deposition. As such, the additional chamber would adversely impact throughput of the system. Also, an additional chamber adds substantial cost to a system.

Therefore, there is a need in the art for a modified cluster tool and a method of utilizing such a modified cluster tool that provides for PVD seed layer deposition without replacing a CVD or electroplating chamber in the cluster tool.

SUMMARY OF THE INVENTION

The disadvantages associated with the prior art are overcome by the present invention of a multiple chamber semiconductor wafer processing system having a metallization cluster of metallization chambers and a pre-metallization cluster of pre-process chambers that are interconnected by at least one transition chamber that is adapted to deposit a material upon a wafer. In a specific embodiment of the invention, the transition chamber is a physical vapor deposition (PVD) chamber that is capable of flash coating a wafer with a material such as copper. The wafer having a PVD copper layer (a seed layer) can then be rapidly processed in a chemical vapor deposition (CVD) chamber to deposit a second layer of material such as bulk copper over the seed layer.

The invention also includes a method that moves a wafer from a pre-metallization chamber in a pre-metallization cluster to the transition chamber where the chamber flash coats the semiconductor wafer with a thin layer of material, for example, PVD copper. This flash coating forms an initial step to the bulk deposition of copper by CVD in the metallization chambers of the tool. Once flash coated, the wafer is moved to a metallization chamber in the metallization cluster for CVD processing. By using such a method, the adhesion of the subsequently-deposited bulk CVD copper layer is significantly improved without any sacrifice in the throughput of the cluster tool.

Additionally, the tool can be used to provide an integrated metal deposition solution. Within the present invention, conventional pre-metallization chambers are available for pre-processing a wafer prior to metal deposition, i.e., the wafer is oriented and degassed. One pre-metallization chamber in the pre-metallization cluster is used to preclean the wafer prior to metal deposition. Thereafter, another pre-metallization chamber capable of depositing a barrier layer such as tantalum nitride or titanium nitride is used to form a barrier layer upon the wafer. Once a barrier is deposited, the wafer is placed in the transition chamber and flash coated with a first material, such as a copper seed layer. The flash coated wafer is then moved by the process cluster's wafer transport mechanism to a CVD process chamber for deposition of a layer of a second material such as bulk copper. The wafer is then moved from the metallization chamber to one of the transition chambers. The pre-metallization cluster's wafer transport mechanism moves the wafer from the transition chamber to one of the pre-metallization chambers, if necessary, or a load lock. As such, the invention provides an integrated system for depositing metal, such as copper, with good adhesion upon a semiconductor wafer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention is directed to an improvement in the deposition of layers of copper in a multiple chamber semiconductor processing tool commonly referred to as a cluster tool. Cluster tools are typically configured as clusters of chambers each surrounding a robotic transfer mechanism and operably connected to one another by transition chambers which are utilized to pass wafers between the robotic transfer mechanisms of the individual clusters. Transition chambers heretofore have been utilized to provide optional precleaning and cool down functions in addition to their pass-through function. In accordance with the invention, the transition chamber is a PVD chamber that is used to flash coat a wafer with a copper seed layer as well as provide a pass-through function.

A cluster tool is generally comprised of at least one metallization cluster and a pre-metallization cluster. The metallization cluster comprises the metal deposition chambers. The pre-metallization cluster is comprised of two load/lock chambers to admit and discharge wafers from the tool as well as a plurality of chambers that degas the surface of the wafers, prepare the surface for deposition, if required, deposit a barrier layer, and perform a variety of other functions ancillary to the metallization process.

An illustrative multiple chamber semiconductor wafer processing tool for performing the method of the invention is known as the Endura® System manufactured by Applied Materials, Inc. of Santa Clara, Calif.

Figure 1:
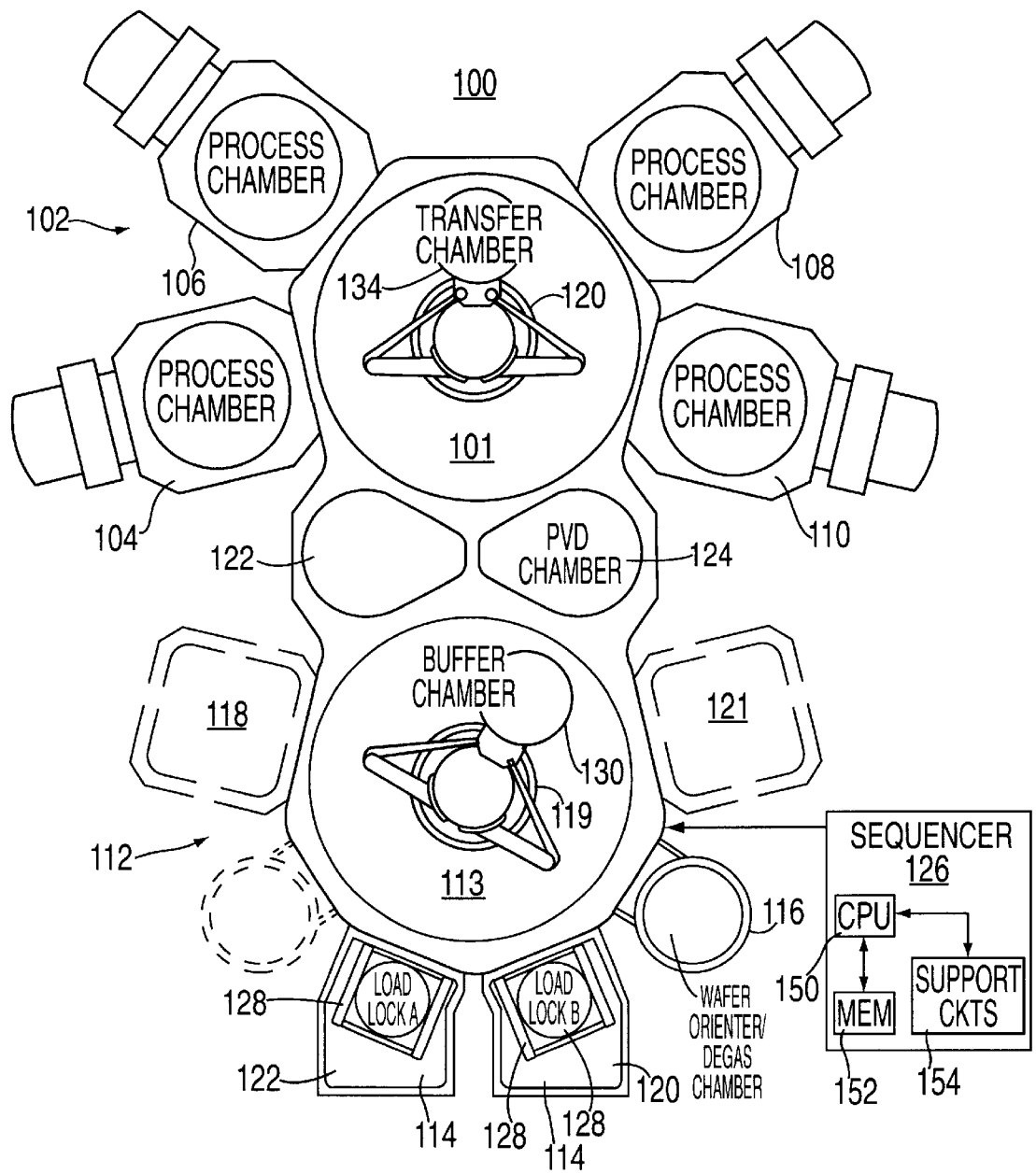
FIG. 1 is a schematic diagram of an illustrative multiple chamber semiconductor wafer processing cluster tool incorporating the present invention.

FIG. 1 depicts a cluster tool 100 similar to an Endura System, but having a transition chamber that is configured in accordance with the present invention. The tool 100 is comprised of a metallization cluster 102 and a pre-metallization cluster 112. The metallization cluster 102 consists of four process chambers 104, 106, 108 and 110 wherein wafers are processed, such as by CVD copper deposition. The pre-metallization cluster 112 consists of two load lock chambers 114 which admit and withdraw wafers from the system, a wafer orientation/degas chamber 116 and, in the configuration shown, a preclean chamber 118 for sputter cleaning the wafer, and a barrier layer deposition chamber 121. The metallization cluster 102 and the pre-metallization cluster 112 each contain robotic wafer handling mechanisms 119 and 120 that transport the wafers amongst the chambers within their respective clusters.

Separating the metallization cluster 102 and the pre-metallization cluster 112 is at least one transition chamber, for example, the pass-through chamber 122. The invention provides, as one embodiment of the invention, a PVD chamber 124 as a second transition chamber that deposits a copper seed layer by flash coating the wafer with copper. These transition chambers 122 and 124 will be discussed in more detail below. The operation of the cluster tool is controlled by a sequencer 126.

The sequencer 126 is a general purpose computer containing a central processing unit (CPU) 150, a memory 152, and support circuits 154. The CPU 150 operates in a manner defined by one or more programs stored in the memory 152, e.g., RAM, ROM, floppy disk, hard disk and the like. The support circuits 154 includes conventional power supplies, clock circuits, cache, and the like. The programs executed by the CPU 150 cause the cluster tool 100 to perform various operations as discussed below.

In operation, wafers are carried from storage to the cluster tool 100 in a plastic transport cassette 128 that is placed within one of the loadlock chambers 114. The robotic transport mechanism 119 within buffer chamber 113 transports the wafers, one at a time, from the cassette 128 to any of the chambers 116, 118, 122 and 124 within the pre-process cluster 112. To transport the wafers amongst the chambers, individual wafers are carried upon a wafer transport blade 130 located at the distal end of the robotic transfer mechanism 119. In a typical process sequence, a wafer is first placed in the conventional wafer orienter/degas chamber 116, then moved to the conventional preclean chamber 118.

Once precleaned, the wafer is ready for processing and the wafer transport mechanism 120 in a transfer chamber 101 moves the wafer from the preclean chamber 122 to a transition chamber 124 or the barrier layer deposition chamber 121. If a barrier layer is desired before metallization, the wafer may be placed in a CVD chamber 121 to deposit a TiN barrier layer upon the wafer. Alternatively, TiN deposition may be accomplished using a PVD chamber. Of course, other barrier layer materials may also be deposited. Once the barrier layer is deposited, the wafer is transferred to the PVD chamber 124.

The robotic transfer mechanism 120 in the metallization cluster 102 is surrounded by and has access to the four process chambers 104, 106, 108 and 110, as well as the transition chamber 122 and the PVD chamber 124. The robotic transfer mechanism 120 procures a wafer from the PVD chamber 124 for the first stage of bulk metallization, e.g., copper deposition over a seed layer.

Once the PVD copper deposition (seed layer) has been completed, the wafer can be moved to the second process chamber 104 for a second stage of processing (e.g., CVD deposition of bulk copper). Upon completion of processing, the robotic transport mechanism 120 moves the wafer from the final process chamber (for example, chamber 110) to either the transition chamber 122 or the PVD chamber 124. No processing occurs in either of these chambers at this time, the transition chambers are merely used to pass the wafer to the buffer chamber 113. The wafer is then removed from the transition chamber 122 or 124 by the robotic transport mechanism 119 in the buffer chamber 113 and finally deposited in the other load lock 114 through which it is withdrawn from the system.

A cluster tool such as illustrated in FIG. 1 may contain additional clusters and may have more than one set of load lock chambers 114. The tool may also contain a cool down chamber, for example, wherein a wafer is positioned after processing to cool down to a relatively low temperature before being placed in the wafer cassette. Additionally, there may be more than one process chamber performing the same function, e.g., CVD deposition of bulk copper, and it may be possible that a given wafer may visit less than the full compliment of process chambers in its trace through the system.

A processing sequence is established for wafers to be processed, including the conditions of all operations to be performed thereon and their sequence. The sequencer 126 schedules the movement of the wafers through the cluster tool in accordance with a sequencing program. A cluster tool's throughput is the number of wafers to be processed by the tool in a given unit of time. Those skilled in the art will appreciate that there are many ways to improve the tool's throughput for a given sequence. One important way is to use efficient scheduling routines for a given processing sequence. It is desirable that wafers efficiently move through a cluster tool so that the tool achieves a steady-state throughput.

The foregoing considerations notwithstanding, it is critical that any solution to the problem of poor adhesion of layers of copper deposited on a semiconductor wafer, must be one that meets rigid quality standards for semiconductor processing yet does not materially detract from the throughput of the cluster tool. It is considered unexpected that the solution provided in accordance with the present invention not only does not adversely affect throughput, but may actually improve it.

In accordance with the present invention, a wafer being transported through a transition chamber in a cluster tool receives a flash coating of PVD copper in the PVD chamber 124. Flash coating in the context of the present invention means that the wafer is in the transition chamber 124 of the tool 100 for less than a minute, preferably from 10 to 60 seconds to deposit a layer of PVD copper having a thickness from about 50 to 100 Å. Since the layer of PVD copper is very thin, the constraints of depositing it are somewhat less than would govern the deposition of a thicker layer of copper in a process chamber, i.e., reflectivity and uniformity of the layer may be quite poor.

Figure 2:
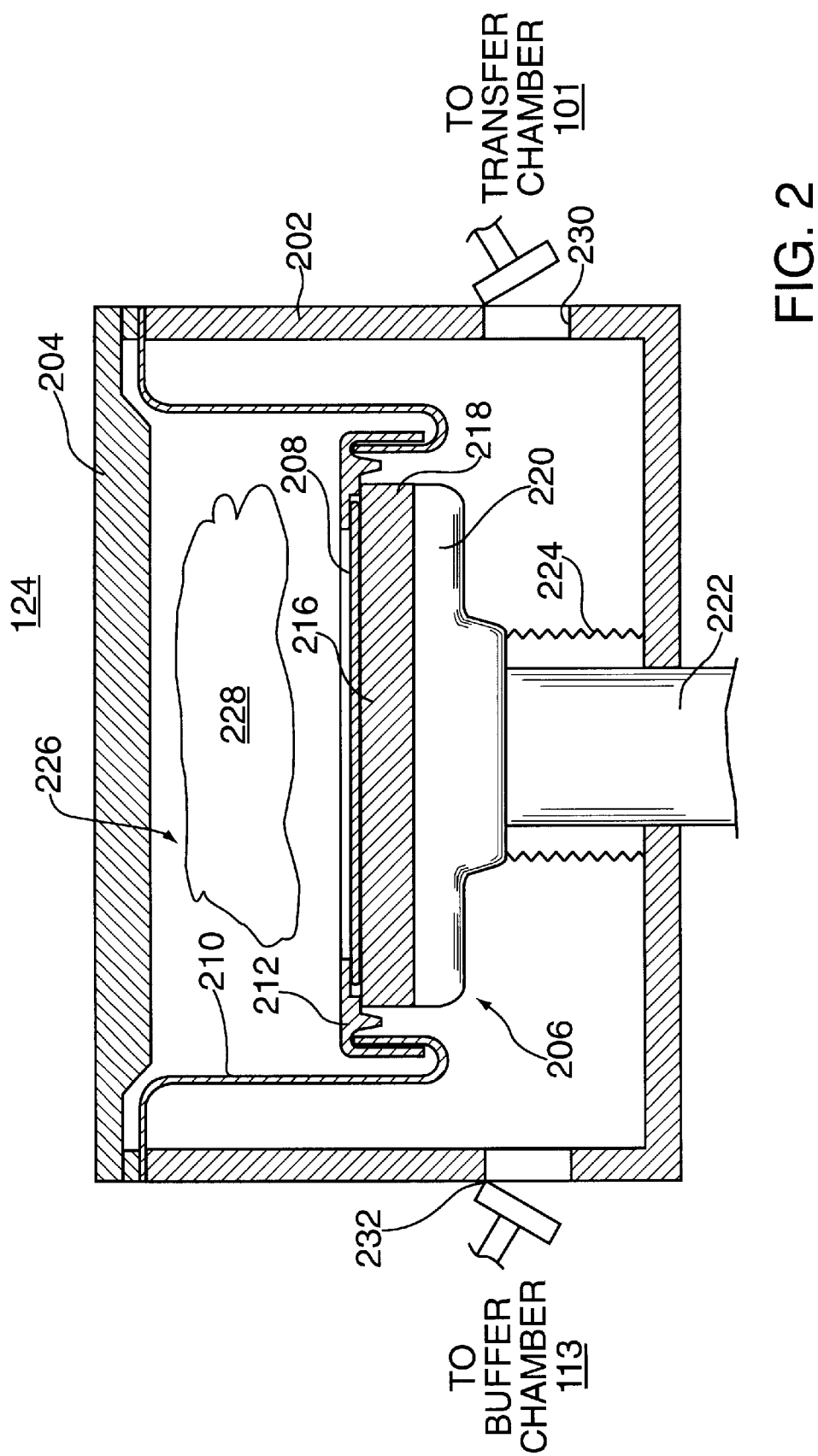
FIG. 2 is a simplified, cross-sectional, schematic view of a PVD transition chamber in accordance with the present invention.

FIG. 2 depicts a simplified, cross-sectional, schematic view of a physical vapor deposition (PVD) chamber 124 incorporating the present invention that flash coats the wafer. The chamber 124 contains an enclosure 202 and a copper target 204 which define a volume within which a pedestal 206 supports a semiconductor wafer 208. A plasma zone 226 is defined by a cylindrical shield 210 which supports a shadow ring 212 that rests upon a waste ring 214. The waste ring 214 is supported by an electrostatic chuck 216. The waste ring 214 rests upon a flange 218 extending circumferentially from the edge of the electrostatic chuck 216. The chuck is attached generally by a peripheral clamp, bolts or brazing to a support 220. The support 220 is connected to a shaft 222 which is sealed from the environment of the chamber by bellows 224. The bellows are sealed to the bottom of the chamber enclosure 202 and also the support 220 at each end of the bellows.

FIG. 2 depicts the system having the pedestal 206 in a process position, that is, with the pedestal raised to have the waste ring 214 engage the shadow ring 212. In this position, a plasma 224 is formed above the wafer 208 and the target 204 is sputtered to flash coat the wafer with copper. The wafer is retained by an electrostatic force between the wafer 208 and the electrostatic chuck 216.

In a wafer removal position, the pedestal 208 is lowered to allow a wafer transport mechanism 120 to access the chamber 202 through a slit valve 230. From this position, the wafer is dechucked. Once the wafer is removed the next wafer can be positioned upon the chuck 216 and the pedestal 206 raised into the processing position. Since the chamber is also a transition chamber, a second slit valve 232 is provided to permit the wafer transport mechanism 119 to access the chamber to retrieve the wafer.

Those skilled in the art will appreciate that the modifications required to practice the improved processing of the present invention are easily retrofitted onto an existing cluster tool with minimum capital expense. Moreover, since the layer of copper flash-deposited onto the wafer by the present process requires only a very short residence time in the transition chamber, it is more than offset by the gain in the time required for the deposition of the first CVD coating of bulk copper thereover. The reason for this is that the process of CVD copper is relatively slow over the initial wafer surface, but increases in speed of deposition as the layer of copper begins to build. Hence, initiating the process over a copper coated substrate actually requires less time overall than just the CVD deposition on a wafer coated with, e.g., titanium nitride.

Figure 3:
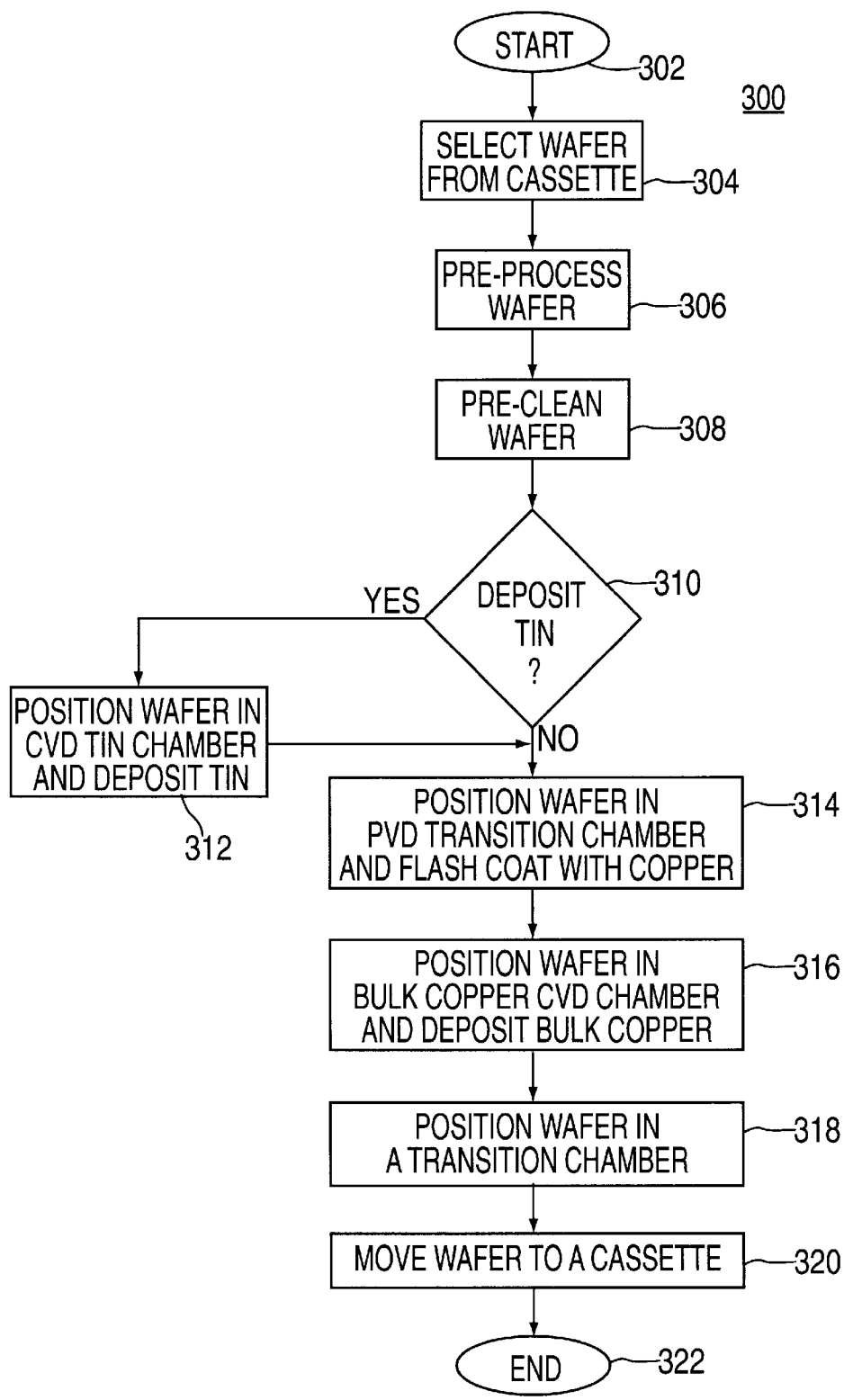
FIG. 3 depicts a flow diagram of the routine that is executed by the sequencer of the cluster tool of FIG. 1 to implement a method of the present invention.

FIG. 3 depicts a flow diagram of a routine 300 that represents the processing steps that the sequencer executed in accomplishing the present invention. The routine 300 begins at step 302 and proceeds to step 304. At step 304, the buffer chamber's wafer transport mechanism selects a wafer from the wafer cassette and moves the selected wafer to a pre-process chamber. At step 306, the wafer is pre-metallization, e.g., wafer orientation, wafer degas, and the like. At step 308, the wafer is moved by the buffer chamber's wafer transport mechanism to the preclean chamber wherein the wafer is cleaned by a gaseous plasma, e.g., an argon plasma. At step 310, the routine queries whether the process sequence includes a step of depositing titanium-nitride (TiN) onto the wafer. If the query is affirmatively answered, the routine proceeds to step 312 wherein the wafer is moved by the transfer chamber's wafer transport mechanism to a TiN CVD or PVD chamber to deposit a barrier layer.

Once TiN deposition is completed or the query at step 310 is negatively answered, the wafer is moved to the PVD chamber wherein a flash coating of copper (a copper seed layer) is deposited at step 314. This process requires 10 to 60 seconds. Once complete, the wafer is moved by the transfer chamber's wafer transport mechanism to a bulk copper CVD chamber wherein, at step 316, bulk copper is deposited atop the seed layer. The wafer may undergo other processes after or in between the foregoing steps to anneal layers, oxygen stuff the layers or otherwise improve layer properties.

Once processing is completed in the metallization cluster, the wafer transport mechanism, at step 318, places the wafer in a transition chamber. At step 320, the buffer chamber's wafer transport mechanism then retrieves the wafer from the transition chamber and places it in a wafer cassette. The wafer may be placed in a cooldown chamber prior to placement in the cassette. The routine ends at step 322.

The method and apparatus of the present invention markedly improves the adhesion of CVD deposited copper layers on a wafer surface. While not wishing to be bound by any particular theory, it is believed that since a slowly deposited CVD copper layer carries impurities to the surface, increasing the speed of deposition results in fewer impurities being deposited, particularly at the interface of the copper layer and the surface of the wafer. As stated above, depositing the CVD bulk copper onto a thin PVD copper layer materially increases the speed of the overall deposition. Since the PVD deposition does not chemically react with the surface, the interface has much lower impurities, hence adhesion is markedly improved.

The foregoing embodiment of the invention utilizes a PVD chamber as a transition chamber between the metallization cluster and the pre-metallization cluster within a cluster tool. The specific use of a PVD chamber should be considered an illustrative embodiment. Other process chambers could be used as a transition chamber to provide other embodiments of the invention. For example, the transition chamber could be an IMP chamber, a CVD chamber, or some other chamber that processes the wafer in a manner that would improve wafer throughput of the tool.

Although the present invention has been described in terms of particular embodiments, numerous changes can be made to the sequence of steps to be carried out subsequent to the deposition of the CVD copper layer or the particular configuration of the cluster processing tool as will be known to those skilled in the art. The invention is only meant to be limited in accordance with the limitations of the appended claims.

What is claimed is:

1. A method of depositing a material upon a semiconductor wafer comprising the steps of:

moving a wafer from a first chamber within a first cluster of chambers to a transition chamber;

depositing, within said transition chamber, a first layer of said material; and moving said wafer from said transition chamber to a second chamber in a second cluster of chambers for depositing a second layer upon said first layer.

2. The method of claim 1 wherein said first layer of material is a copper seed layer.

3. The method of claim 2 wherein said copper seed layer is deposited using physical vapor deposition.

4. The method of claim 2 wherein said copper seed layer is deposited using a flash coating process.

5. The method of claim 2 wherein said copper seed layer is about 50 to 100 Å thick.

6. The method of claim 2, wherein the wafer is in residence in the transition chamber for less than about one minute.

7. The method of claim 2 wherein said second layer of material is bulk copper.

8. The method of claim 4 wherein said bulk copper is deposited using chemical vapor deposition.

9. The method of claim 1 wherein both said moving steps are performed by a wafer transport mechanism.

* * * * *